United States Patent
Chen et al.

(10) Patent No.: US 8,116,464 B2
(45) Date of Patent: Feb. 14, 2012

(54) METHOD FOR VOLUME ADAPTATION, MOBILE ELECTRONIC DEVICE AND COMPUTER PROGRAM PRODUCT USING THE METHOD THEREOF

(75) Inventors: Chun Chen, Shanghai (CN); Xu-Jun Qiu, Shanghai (CN); Tony Tsai, Taipei (TW)

(73) Assignee: Inventec Appliances Corp., New Taipei (TW)

( * ) Notice: Subject to any disclaimer, the term of this patent is extended or adjusted under 35 U.S.C. 154(b) by 378 days.

(21) Appl. No.: 12/479,044

(22) Filed: Jun. 5, 2009

(65) Prior Publication Data
US 2010/0166196 A1 Jul. 1, 2010

(30) Foreign Application Priority Data
Dec. 29, 2008 (TW) .............................. 97151221 A

(51) Int. Cl.
*H03G 3/20* (2006.01)
(52) U.S. Cl. ......................................... 381/57; 381/107
(58) Field of Classification Search .................... 381/56, 381/57, 104, 107
See application file for complete search history.

(56) References Cited

U.S. PATENT DOCUMENTS

| | | | |
|---|---|---|---|
| 7,469,051 B2* | 12/2008 | Sapashe et al. | 381/104 |
| 2005/0013443 A1* | 1/2005 | Marumoto et al. | 381/56 |
| 2005/0063552 A1* | 3/2005 | Shuttleworth et al. | 381/57 |
| 2005/0226442 A1* | 10/2005 | Landon et al. | 381/104 |
| 2006/0126856 A1* | 6/2006 | Chien et al. | 381/57 |
| 2007/0126503 A1* | 6/2007 | Hsieh et al. | 330/129 |
| 2008/0267427 A1* | 10/2008 | Johnston | 381/101 |

* cited by examiner

*Primary Examiner* — Benjamin Sandvik
(74) *Attorney, Agent, or Firm* — J.C. Patents

(57) ABSTRACT

A method for volume adaptation, a mobile electronic device and a computer program product are disclosed. According to the method for volume adaptation, a sound producing function is started. At intervals, a present first environmental noise is sampled, a present set playing volume of the mobile electronic device is inquired about, and a second environmental noise occurring on setting the playing volume is obtained. Finally, the playing volume is adjusted according to the first environmental noise and the second environmental noise. In this way, the present invention is able to automatically adjust the playing volume thereof in response to the environmental noises of different times, which largely increases the convenience of using the mobile electronic device.

24 Claims, 3 Drawing Sheets

METHOD FOR VOLUME ADAPTATION, MOBILE ELECTRONIC DEVICE AND COMPUTER PROGRAM PRODUCT USING THE METHOD THEREOF

CROSS-REFERENCE TO RELATED APPLICATION

This application claims the priority benefit of Taiwan application serial no. 97151221, filed on Dec. 29, 2008. The entirety of the above-mentioned patent application is hereby incorporated by reference herein and made a part of specification.

BACKGROUND OF THE INVENTION

1. Field of the Invention

The present invention generally relates to a method for volume adaptation, and more particularly, to a method for adjusting a playing volume according to the environmental noise and the relevant applications thereof.

2. Description of Related Art

Along with the progress of science and technology, an electronic device must be designed to have powerful functions and a light and small-sized figure. Various mobile electronic devices satisfying the current customers pursuing portability have been more and more favored by modern people. Taking a mobile phone as an example, it serves as a considerably popular communication means over the world today. A modern mobile phone functions not only in the traditional communication, but also in Internet online, playing multimedia files and so on to meet the requirements of users to catch the trend of variety today.

The great portability of a mobile phone, like a two-edged sword, makes the phone applicable in various complicate and varied environments during playing a multimedia file or making a call, where the environments are not supposedly quiet and suitable for listening. In fact, too noisy surroundings would largely degrade the hearing perceptions.

When a user is aware of too noisy surrounding and fails to clearly hear the sound given by a mobile phone, in general, the user would manually and directly adjust the playing volume of the mobile phone. Nevertheless, when the environmental noise varies quickly, the user must frequently conduct adjustment manipulations by hand, which brings great inconveniences and may break a proceeding action of the user. All the above-mentioned situations bother the user a lot and remain a bad impression on the usage of a mobile phone with the user.

SUMMARY OF THE INVENTION

Accordingly, the present invention is directed to a method for volume adaptation, so that a user using a mobile electronic device does not need to manually adjust the playing volume.

The present invention is also directed to a mobile electronic device, which is able to automatically adjust the playing volume in response to the environmental noise and exempt the inconvenience of manual adjustments.

The present invention is further directed to a computer program product, wherein the program instructions included by the computer program can be loaded into a mobile electronic device for use. By executing the above-mentioned program instructions, the mobile electronic device is able to periodically and automatically adjust the playing volume in response to the environmental noise.

The present invention provides a method for volume adaptation used for a mobile electronic device with a sound producing function. The method includes the following steps. First, the sound producing function is started. At intervals a present first environmental noise is sampled, a present set playing volume of the mobile electronic device is inquired about, and a second environmental noise occurring on setting the playing volume is obtained. Finally, the playing volume is adjusted according to the first environmental noise and the second environmental noise.

In an embodiment of the present invention, wherein the step of starting the sound producing function includes playing a multimedia file by using the mobile electronic device, or receiving or making a call by using the mobile electronic device.

In an embodiment of the present invention, wherein an interval between two times of sampling the first environmental noise corresponds to a type of function presently performed by the mobile electronic device.

In an embodiment of the present invention, wherein the step of sampling the first environmental noise includes recording a sound by using a recording unit of the mobile electronic device and then extracting the first environmental noise from the sound. The step of extracting the first environmental noise in the sound includes, for example, analyzing a waveform of the sound to extract the first environmental noise.

In an embodiment of the present invention, wherein after the steps of sampling the first environmental noise, inquiring about the playing volume, and obtaining the second environmental noise, the method further includes judging whether or not the first environmental noise is greater than or equal to the playing volume, wherein the step of adjusting the playing volume is performed when the first environmental noise is judged to be greater than or equal to the playing volume.

In an embodiment of the present invention, wherein the step of adjusting the playing volume according to the first environmental noise and the second environmental noise includes judging whether or not the first environmental noise is greater than or equal to the second environmental noise and, when the first environmental noise is judged to be greater than or equal to the second environmental noise, adding a difference between the first environmental noise and the second environmental noise to the playing volume; when the first environmental noise is judged to be less than the second environmental noise, adding the second environmental noise to the playing volume.

In an embodiment of the present invention, wherein the step of adjusting the playing volume according to the first environmental noise and the second environmental noise includes adding a sum of the first environmental noise and the second environmental noise to the playing volume.

In an embodiment of the present invention, the method for volume adaptation further includes sampling an environmental noise occurring in each time when setting the playing volume, and saving the environmental noise as the second environmental noise.

On the other hand, the present invention also provides a mobile electronic device, which includes a sound-producing unit, a data collection unit and an adjusting unit. The sound-producing unit is for starting a sound producing function. The data collection unit is coupled to the sound-producing unit for, at intervals and when the sound producing function is started, sampling a present first environmental noise, inquiring about a present set playing volume of the mobile electronic device, and obtaining a second environmental noise occurring on setting the playing volume. The adjusting unit is coupled to the data collection unit for adjusting the playing volume according to the first environmental noise and the second environmental noise.

In an embodiment of the present invention, wherein the sound-producing unit includes a multimedia file playing unit for playing a multimedia file.

In an embodiment of the present invention, wherein the sound-producing unit includes a communication unit for receiving or making a call.

In an embodiment of the present invention, wherein an interval between two times of sampling the first environmental noise corresponds to a type of function presently performed by the mobile electronic device.

In an embodiment of the present invention, the mobile electronic device further includes a recording unit. The recording unit is coupled to the data collection unit for recording a sound, wherein the data collection unit extracts the first environmental noise from the sound. Besides, the data collection unit analyzes a waveform of the sound to extract the first environmental noise.

In an embodiment of the present invention, wherein the adjusting unit is used to judge whether or not the first environmental noise is greater than or equal to the playing volume and, when the first environmental noise is judged to be greater than or equal to the playing volume, the adjusting unit is used to adjust the playing volume according to the first environmental noise and the second environmental noise.

In an embodiment of the present invention, wherein the adjusting unit is used to judge whether or not the first environmental noise is greater than or equal to the second environmental noise and, when the first environmental noise is judged to be greater than or equal to the second environmental noise, the adjusting unit is used to add a difference between the first environmental noise and the second environmental noise to the playing volume.

In an embodiment of the present invention, wherein when the first environmental noise is judged to be less than the second environmental noise, the adjusting unit is used to add the second environmental noise to the playing volume.

In an embodiment of the present invention, wherein the adjusting unit is used to add a sum of the first environmental noise and the second environmental noise to the playing volume.

In an embodiment of the present invention, the mobile electronic device further includes a storage unit coupled to the data collection unit, wherein each time when setting the playing volume, the data collection unit is used to sample an environmental noise occurring in said each time and to save the environmental noise as the second environmental noise into the storage unit.

The present invention further provides a computer program product, which includes at least a program instruction, wherein the program instruction is to be loaded into a mobile electronic device having a sound producing function for performing the following steps: starting the sound producing function; at intervals, sampling a present first environmental noise, inquiring about a present set playing volume of the mobile electronic device, and obtaining a second environmental noise occurring on setting the playing volume; and adjusting the playing volume according to the first environmental noise and the second environmental noise.

Based on the described above, the present invention is able to take not only the present environmental noise but also the environmental noise occurred in each time when setting the playing volume in consideration for adjusting the playing volume of the mobile electronic device. In this way, the present invention is advantageous in adjusting the playing volume more objectively to adapt the surrounding situation and avoiding manually adjusting so as to benefit the user with more convenience.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
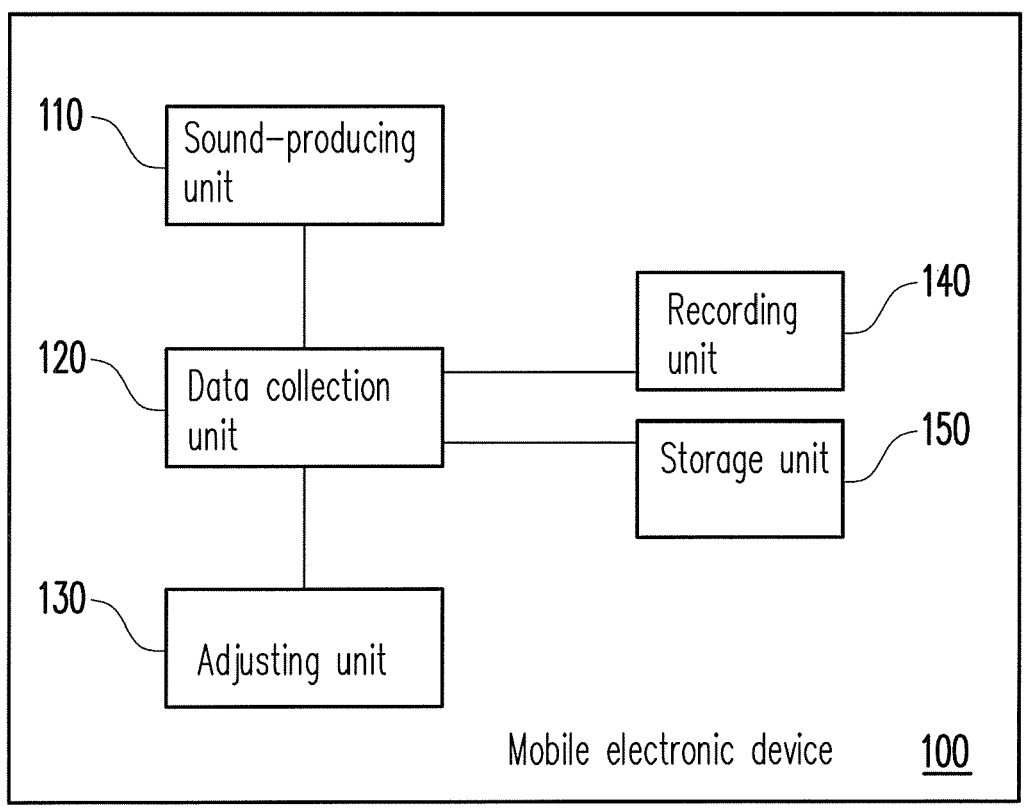
FIG. 1 is a block diagram of a mobile electronic device according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a block diagram of a mobile electronic device according to an embodiment of the present invention. Referring to FIG. 1, a mobile electronic device 100 includes a sound-producing unit 110, a data collection unit 120, an adjusting unit 130, a recording unit 140 and a storage unit 150. The mobile electronic device 100 herein is, for example, mobile phone, personal digital assistant (PDA), PDA mobile phone, smart mobile phone or other mobile electronic devices having a sound producing function, which the present invention is not limited to. In the following, the functions of the units in the mobile electronic device 100 are depicted.

The sound-producing unit 110 can include, but not limited by the present invention, speaker or other hardware, software, or combination of hardware and software for transmitting voice to a user. The sound-producing unit 110 is in charge of starting the sound producing function. In an embodiment, the sound-producing unit 110 is, for example, a multimedia file playing unit with the functions of playing various multimedia files such as music or video and transmitting the acoustic source of the above-mentioned file to a user for listening. In another embodiment, the sound-producing unit 110 can be a communication unit for receiving incoming call or for a user to make a call, wherein the communication unit allows the user to hear the other caller during communication.

The data collection unit 120 is electrically connected to the sound-producing unit 110. At intervals and when the sound producing function is started, the data collection unit 120 inquires about a present set playing volume of the mobile electronic device 100, samples a present first environmental noise through the recording unit 140, and obtains a second environmental noise from the storage unit 150. The second environmental noise is, for example, occurring on the time of the user previously set the playing volume by manual. In the embodiment, the data collection unit 120 can be hardware, software, or combinations of hardware and software with processing capability, which the present invention is not limited to.

The adjusting unit 130 is electrically connected to the data collection unit 120 and can be hardware, software, or combinations of hardware and software with operation and processing capability. The adjusting unit 130 is for automatically adjusting the playing volume of the mobile electronic device 100 according to the data collected by the data collection unit 120.

It should be noted that the mobile electronic device 100 functions to automatically adjust the playing volume in response to the environmental noise and also to allow a user manually setting the playing volume. However, each time when the user manually sets the playing volume, the data collection unit 120 would, for example, control the recording unit 140 to sample an environmental noise occurring in the each time, and save the environmental noise as the second environmental noise into the storage unit 150. In other words, the environmental noise occurred at each time when setting the playing volume by the user will be recorded in the storage unit 150, wherein the storage unit 150 can be memory or other storage media.

Figure 2:
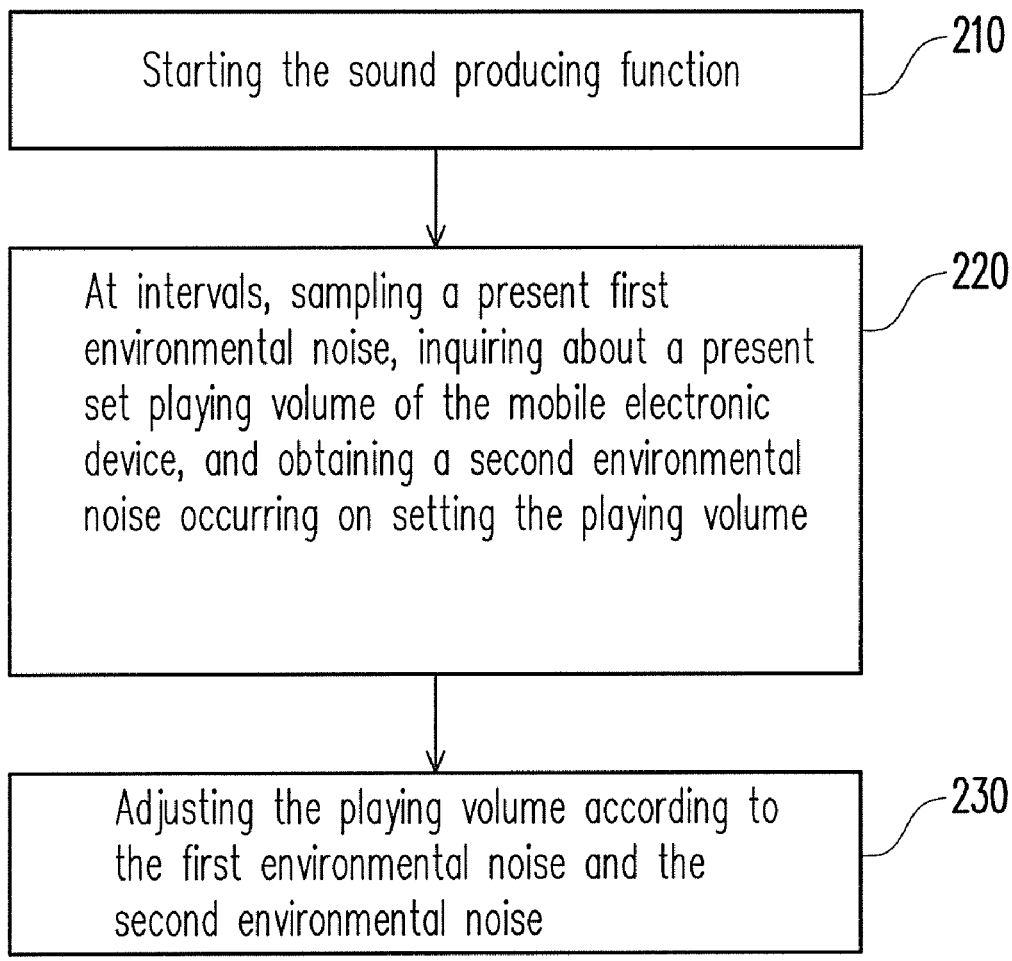
FIG. 2 is a flowchart showing a method for volume adaptation according to an embodiment of the present invention.

In the following, another embodiment is depicted to further explain how the invented mobile electronic device 100 uses the above-mentioned units to automatically adjust the playing volume. FIG. 2 is a flowchart showing a method for volume adaptation according to an embodiment of the present invention. Referring to FIGS. 1 and 2, first in step 210, when a user wants to play a multimedia file or make a phone call, the sound-producing unit 110 would start the sound producing function of the mobile electronic device 100, so that the user is able to enjoy the multimedia file or hear the other caller during communication.

Next in step 220, the data collection unit 120 determines an interval between two times of sampling the first environmental noise corresponds to a type of function presently performed by the mobile electronic device 100. At intervals, the data collection unit 120 samples a present first environmental noise, inquires about a present set playing volume of the mobile electronic device 100, and obtains a second environmental noise occurring on setting the playing volume (e.g. the last time of setting the playing volume manually).

Taking an example, when the mobile electronic device 100 performs the calling function, the data collection unit 120 would set a shorter interval (for example, about 1 to 2 seconds), so that various information serving as the base for automatically adjusting the playing volume can be collected more frequently to ensure the user clearly and instantly hearing the other caller during communication. In another embodiment, when the mobile electronic device 100 plays a multimedia file, the data collection unit 120 would set a longer interval (for example, about 3 to 5 seconds). Under the situation of enjoying a multimedia file, the need of instantly listening the audio of the multimedia file is not critical, so that the data collection unit 120 is allowed to collect the required information at the time points spaced by a longer interval and such scheme can ensure the hearing perceptions of the user without occupying too many hardware resources.

In the embodiment, the data collection unit 120 inquires about the content saved in the storage unit 150 so as to obtain the second environmental noise occurring in each time when setting the playing volume by the user. While the data collection unit 120 samples the present first environmental noise, for example, the recording unit 140 would record a sound and the first environmental noise is extracted from the sound. The sound recorded by the recording unit 140 may include the caller voice and the environmental noise mixed up together. Therefore, the data collection unit 120 of the embodiment would analyze a waveform of the sound recorded by the recording unit 140 to remove the signal of the caller sound. In more details, since the user is quite close to the mobile electronic device 100, the user voice component recorded by the recording unit 140 is more clear and more loud than the recorded environmental noise component; therefore, the waveform corresponding to the user sound is more sharp-like, which enables the data collection unit 120 to easily remove the sharp-like waveform so as to extract the first environmental noise in the sound.

After the data collection unit 120 gets the present playing volume of the mobile electronic device 100, the first environmental noise and the second environmental noise, the method goes to step 230, where the adjusting unit 130 adjusts the playing volume according to the first environmental noise and the second environmental noise. For example, the adjusting unit 130 adds the sum of the first environmental noise and the second environmental noise to the playing volume so as to ensure the playing volume after adjusting is dominant over the environmental noise and the user is able to clearly hear the multimedia file or the opposite caller. It should be noted that the above-mentioned solution of adding the sum of the first environmental noise and the second environmental noise to the playing volume is just on of the embodiments of the present embodiment, which the present invention is not limit to.

It should be mentioned about that, the method for volume adaptation sown by FIG. 2 is repeatedly conducted after the power of the mobile electronic device 100 is on. That is, whenever turning on the power of the mobile electronic device 100 and starting the sound producing function thereof, the mobile electronic device 100 would automatically adjust the playing volume at each interval. In another embodiment, the user can decide whether or not to make the mobile electronic device 100 automatically adjust the playing volume in response to the environmental noise. For example, when the surrounding noise is less or more stable, or when the user more cares the acoustic performance of the playing file, the function of automatically adjusting the playing volume can be closed so as to enjoy the audio in more details.

Figure 3:
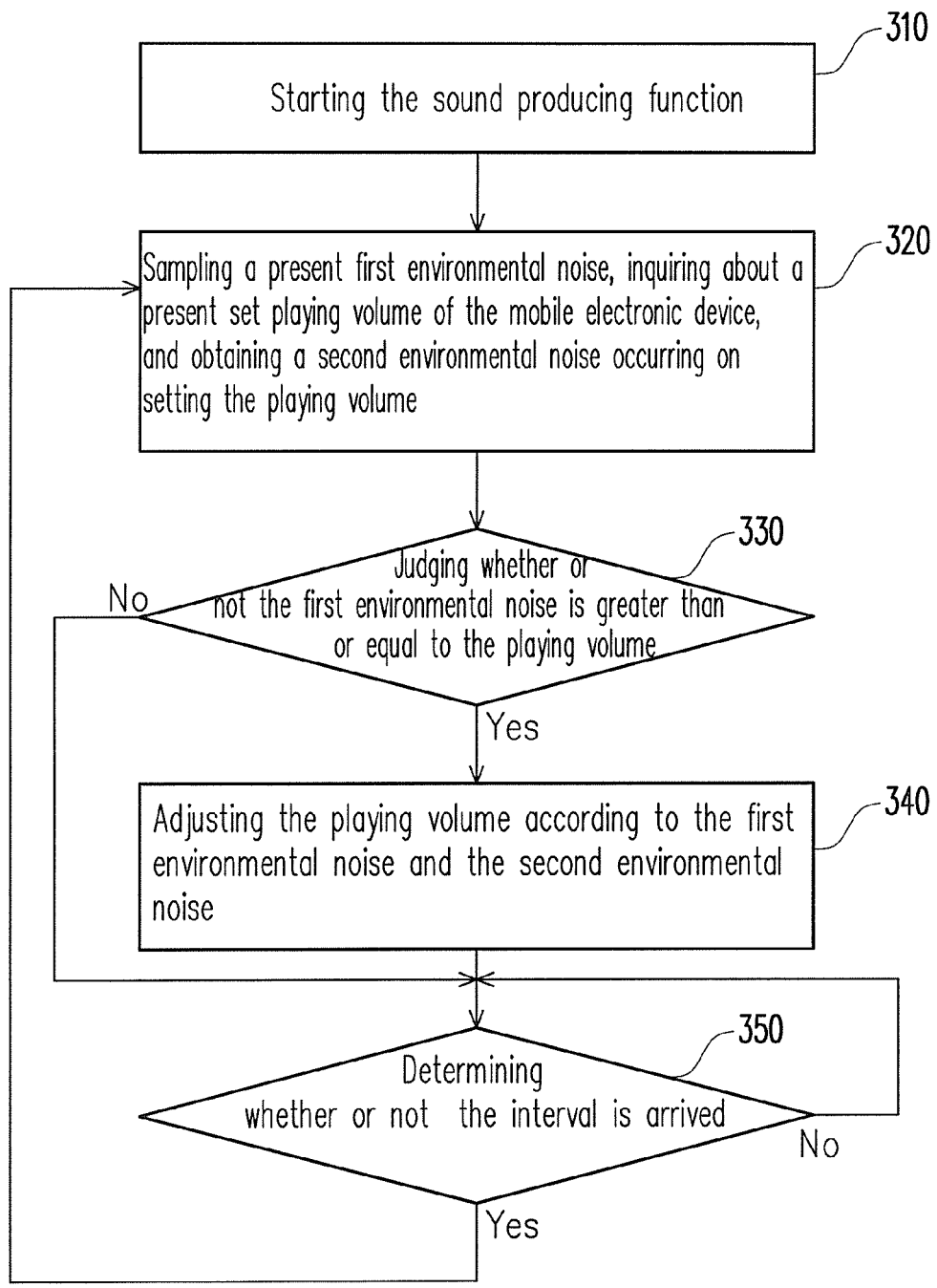
FIG. 3 is a flowchart showing a method for volume adaptation according to another embodiment of the present invention.

FIG. 3 is a flowchart showing a method for volume adaptation according to another embodiment of the present invention. Referring to FIGS. 1 and 3, first in step 310, the sound-producing unit 110 starts the sound producing function of the mobile electronic device 100, wherein the type of the sound producing function is not limited by the present invention. Next in step 320, the data collection unit 120 samples a present first environmental noise, inquires about a present set playing volume of the mobile electronic device 100, and obtains a second environmental noise occurring on setting the playing volume. The way for the data collection unit 120 to obtain the above-mentioned information is the same as or similar to the previous embodiment, and it is omitted to describe.

Then in step 330, the adjusting unit 130 judges whether or not the first environmental noise is greater than or equal to the playing volume. When the first environmental noise is judged to be less than the playing volume, it indicates the present set playing volume of the mobile electronic device 100 allows the user to clearly hear the multimedia file or the opposite caller. Accordingly, the flow of the method for volume adaptation of the embodiment goes to step 350, where the adjusting unit 130 determines whether or not the interval is arrived. When the interval is arrived, the method flow goes back to step 320 and the above-mentioned steps are repeated to judge again whether or not to adjust the playing volume.

However if the first environmental noise is judged to be greater than or equal to the second environmental noise, it indicates the user may not able to clearly hear the audio of the multimedia file or the opposite caller if the presently set playing volume is used to play the multimedia file or to communicate. Therefore, the following action is going to step 340, where the adjusting unit 130 uses the first environmental noise and the second environmental noise to adjust the playing volume. In the embodiment, the adjusting unit 130 judges whether or not the first environmental noise is greater than or equal to the second environmental noise, and when the first environmental noise is judged to be greater than or equal to the second environmental noise, the adjusting unit 130, for example, adds a difference between the first environmental noise and the second environmental noise to the playing volume; if the first environmental noise is judged to be less than the second environmental noise, the adjusting unit 130, for example, directly adds the second environmental noise to the playing volume.

After adjusting the playing volume, the flow goes to step 350, where the adjusting unit 130 determines whether or not the interval is arrived. When the interval is arrived, the method flow goes back to step 320 and the above-mentioned steps are repeated to judge again whether or not to adjust the playing volume.

Taking an example, assuming the user manually sets the playing volume of the mobile electronic device 100 as 50 decibel (dB) and the second environmental noise sampled at that time by the data collection unit 120 is 30 dB. After the user uses the sound-producing unit 110 to start the sound producing function of the mobile electronic device 100 (for example, the user starts the function of playing multimedia file), the mobile electronic device 100 would follow the flowchart of the above-mentioned embodiment to check whether or not needing to automatically adjust the playing volume every 3 to 5 seconds.

Assuming that the interval is arrived and the sampled first environmental noise is 60 dB, since the first environmental noise is judged to be greater than the present set playing volume and the first environmental noise is judged to be greater than the second environmental noise, the adjusting unit 130 would add the difference (30 dB) between the first environmental noise and the second environmental noise to the playing volume. After the adjustment, the playing volume is adjusted to be 80 dB.

It can be seen from the steps of FIG. 3, the mobile electronic device 100 is able to take the environmental noises relative to different times for adjusting the present playing volume. In this way, the user during playing a multimedia file or making a call by using the mobile electronic device 100 has no need to manually adjust the volume, which makes sense for the user to more conveniently use the mobile electronic device 100.

The present invention further provides a computer program product for performing the above-mentioned method for volume adaptation. Basically, the computer program product comprises at least a program instruction (for example, a setting program instruction and a deployment program instruction, etc). After the program instruction is to be loaded into the mobile electronic device having a sound producing function and executed, the above-mentioned steps of the method for volume adaptation can be completed, so that the mobile electronic device can automatically adjust the playing volume thereof in response to the environmental noise.

In summary, the method for volume adaptation, the mobile electronic device and the computer program product of the above-mentioned embodiments are able to automatically adjust the playing volume thereof in response to the environmental noises relative to different times, which favours the user to exempt the job of manually and frequently adjusting the playing volume in response to the environmental noise and largely increases the convenience of using the mobile electronic device.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method for volume adaptation, used for a mobile electronic device with a sound producing function, the method comprising:

starting the sound producing function;

at intervals, sampling a present first environmental noise, inquiring about a present set playing volume of the mobile electronic device, and obtaining a second environmental noise occurring on setting the playing volume; and adjusting the playing volume by judging whether or not the first environment noise is greater than or equal to the second environment noise, when the first environmental noise is judged to be greater than or equal to the second environmental noise, adding a difference between the first environment noise and the second enviroment noise to the playing volume.

2. The method for volume adaptation as claimed in claim 1, wherein the step of starting the sound producing function comprises:

playing a multimedia file by using the mobile electronic device.

3. The method for volume adaptation as claimed in claim 1, wherein the step of starting the sound producing function comprises:

receiving or making a call by using the mobile electronic device.

4. The method for volume adaptation as claimed in claim 1, wherein an interval between two times of sampling the first environmental noise corresponds to a type of function presently performed by the mobile electronic device.

5. The method for volume adaptation as claimed in claim 1, wherein the step of sampling the first environmental noise comprises:

recording a sound by using a recording unit of the mobile electronic device; and extracting the first environmental noise from the sound.

6. The method for volume adaptation as claimed in claim 5, wherein the step of extracting the first environmental noise from the sound comprises:

analyzing a waveform of the sound to extract the first environmental noise.

7. The method for volume adaptation as claimed in claim 1, further comprising:

each time when setting the playing volume, sampling an environmental noise occurring in said each time; and saving the environmental noise as the second environmental noise.

8. A mobile electronic device, comprising:

a sound-producing unit, for starting a sound producing function;

a data collection unit, coupled to the sound-producing unit for, at intervals and when the sound producing function is started, sampling a present first environmental noise, inquiring about a present set playing volume of the mobile electronic device, and obtaining a second environmental noise occurring on setting the playing volume; and an adjusting unit, coupled to the data collection unit for adjusting the playing volume, wherein the adjusting unit is used to judge whether or not the first enviromental noise is greater than or equal to the second enviromental noise, and when the first enviromental noise is judged to be greater than or equal to the second enviromental noise, the adjusting unit is used to add a difference between the first enviromental noise and the second enviromental noise to the playing volume.

9. The mobile electronic device as claimed in claim 8, wherein the sound-producing unit comprises a multimedia file playing unit for playing a multimedia file.

10. The mobile electronic device as claimed in claim 8, wherein the sound-producing unit comprises a communication unit for receiving or making a call.

11. The mobile electronic device as claimed in claim 8, wherein an interval between two times of sampling the first environmental noise corresponds to a type of function presently performed by the mobile electronic device.

12. The mobile electronic device as claimed in claim 8, further comprising:
a recording unit, coupled to the data collection unit for recording a sound, wherein the data collection unit extracts the first environmental noise from the recorded sound.

13. The mobile electronic device as claimed in claim 12, wherein the data collection unit analyzes a waveform of the sound to extract the first environmental noise.

14. The mobile electronic device as claimed in claim 8, further comprising:
a storage unit, coupled to the data collection unit, wherein each time when setting the playing volume, the data collection unit is used to sample an environmental noise occurring in said each time and to save the environmental noise as the second environmental noise into the storage unit.

15. A computer program product, comprising at least a program instruction, wherein the program instruction is to be loaded into a mobile electronic device having a sound producing function for performing the following steps:
starting the sound producing function;
at intervals, sampling a present first environmental noise, inquiring about a present set playing volume of the mobile electronic device, and obtaining a second environmental noise occurring on setting the playing volume; and
adjusting the playing volume according to the first environmental noise and the second environmental noise,
wherein the program instruction directs the mobile electronic device to judge whether or not the first enviromental noise is greater than or equal to the second enviromental noise and, when the first enviromental noise is judged to be greater than or equal to the second enviromental noise, to add a difference between the first enviromental noise and the second enviromental noise to the playing volume, when adjusting the playing volume according to the first enviromental noise and the second enviromental noise.

16. The computer program product as claimed in claim 15, wherein the program instruction directs the mobile electronic device to play a multimedia file when the sound producing function is started.

17. The computer program product as claimed in claim 15, wherein the program instruction directs the mobile electronic device to receive or make a call when the sound producing function is started.

18. The computer program product as claimed in claim 15, wherein an interval between two times of sampling the first environmental noise corresponds to a type of function presently performed by the mobile electronic device.

19. The computer program product as claimed in claim 15, wherein the program instruction directs the mobile electronic device to record a sound through a recording unit and to extract the first environmental noise from the sound, when the first environmental noise is sampled.

20. The computer program product as claimed in claim 19, wherein the program instruction directs the mobile electronic device to analyze a waveform of the sound to extract the first environmental noise when extracting the first environmental noise from the sound.

21. The computer program product as claimed in claim 15, wherein the program instruction directs the mobile electronic device to sample an environmental noise occurring in each time when setting the playing volume and to save the environmental noise as the second environmental noise.

22. A method for volume adaptation, used for a mobile electronic device with a sound producing function, the method comprising:
starting the sound producing function;
at intervals, sampling a present first enviromental noise, inquiring about a present set playing volume of the mobile electronic device, and obtaining a second enviromental noise occurring on setting the playing volume; and
adjusting the playing volume by judging whether or not the first enviroment noise is greater than or equal to the second enviroment noise,
when the first environmental noise is judged to be less than the second environmental noise, adding the second environmental noise to the playing volume.

23. A mobile electronic device, comprising:
a sound-producing unit, for starting a sound producing function;
a data collection unit, coupled to the sound-producing unit for, at intervals and when the sound producing function is started, sampling a present first enviromental noise, inquiring about a present set playing volume of the mobile electronic device, and obtaining a second enviromental noise occurring on setting the playing volume; and
an adjusting unit, coupled to the data collection unit for adjusting the playing volume, when the first environmental noise is judged to be less than the second environmental noise, the adjusting unit is used to add the second environmental noise to the playing volume.

24. A computer program product, comprising at least a program instruction, wherein the program instruction is to be loaded into a mobile electronic device having a sound producing function for performing the following steps:
starting the sound producing function;
at intervals, sampling a present first enviromental noise, inquiring about a present set playing volume of the mobile electronic device, and obtaining a second enviromental noise occurring on setting the playing volume; and
adjusting the playing volume according to the first enviromental noise and the second enviromental noise, when the first enviromental noise is judged to be less than the second enviromental noise, the program instruction directs the mobile electronic device to add the second enviromental noise to the playing volume, after the step of judging whether or not the first enviromental noise is greater than or equal to the second enviromental noise.

* * * * *